(12) United States Patent
Distaso et al.

(10) Patent No.: US 10,290,470 B2
(45) Date of Patent: May 14, 2019

(54) NEGATIVE RIBBON ION BEAMS FROM PULSED PLASMAS

(71) Applicant: Varian Semiconductor Equipment Associates, Inc., Gloucester, MA (US)

(72) Inventors: Daniel Distaso, Merrimac, MA (US); Svetlana B. Radovanov, Brookline, MA (US); Joseph P. Dzengeleski, Hampton, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/644,917

(22) Filed: Jul. 10, 2017

(65) Prior Publication Data

US 2017/0309454 A1    Oct. 26, 2017

Related U.S. Application Data

(63) Continuation of application No. 14/811,272, filed on Jul. 28, 2015, now Pat. No. 9,734,991.

(51) Int. Cl.
*H01J 37/32* (2006.01)
*H01J 27/02* (2006.01)
(Continued)

(52) U.S. Cl.
CPC ...... *H01J 37/32146* (2013.01); *H01J 27/024* (2013.01); *H01J 27/028* (2013.01);
(Continued)

(58) Field of Classification Search
None
See application file for complete search history.

(56) References Cited

U.S. PATENT DOCUMENTS

| 4,523,971 A | 6/1985 | Cuomo et al. |
| 5,517,084 A * | 5/1996 | Leung ............... H01J 27/18 |
| | | 315/111.21 |

(Continued)

OTHER PUBLICATIONS

S. Banna, et al., Inductively Coupled Pulsed Plasmas in the Presence of Synchronous Pulsed Substrate Bias for Robust, Reliable, and Fine Conductor Etching. IEEE Transactions of Plasma Science, 2009, pp. 1730-1746. col. 37, No. 9, IEEE.

(Continued)

*Primary Examiner* — Crystal L Hammond
(74) *Attorney, Agent, or Firm* — Nields, Lemack & Frame, LLC

(57) ABSTRACT

An apparatus and method for the creation of negative ion beams is disclosed. The apparatus includes an RF ion source, having an extraction aperture. An antenna disposed proximate a dielectric window is energized by a pulsed RF power supply. While the RF power supply is actuated, a plasma containing primarily positive ions and electrons is created. When the RF power supply is deactivated, the plasma transforms into an ion-ion plasma. Negative ions may be extracted from the RF ion source while the RF power supply is deactivated. These negative ions, in the form of a negative ribbon ion beam, may be directed toward a workpiece at a specific incident angle. Further, both a positive ion beam and a negative ion beam may be extracted from the same ion source by pulsing the bias power supply multiple times each period.

14 Claims, 8 Drawing Sheets

(51) Int. Cl.
  *H01J 27/16* (2006.01)
  *H01J 37/08* (2006.01)
(52) U.S. Cl.
  CPC .............. *H01J 27/16* (2013.01); *H01J 37/08* (2013.01); *H01J 37/3211* (2013.01); *H01J 37/32422* (2013.01); *H01J 2237/0815* (2013.01); *H01J 2237/0827* (2013.01); *H01J 2237/3151* (2013.01); *H01J 2237/31701* (2013.01); *H01J 2237/31732* (2013.01)

(56) References Cited

U.S. PATENT DOCUMENTS

| | | | |
|---|---|---|---|
| 6,214,162 B1* | 4/2001 | Koshimizu | H01J 37/321 |
| | | | 118/723 I |
| 7,767,561 B2 | 8/2010 | Hanawa et al. | |
| 8,383,001 B2* | 2/2013 | Mochiki | H01J 37/32027 |
| | | | 156/345.1 |
| 9,123,509 B2* | 9/2015 | Papasouliotis | H01J 37/32146 |
| 9,297,063 B2 | 3/2016 | Radovanov et al. | |
| 9,734,991 B2 | 8/2017 | Distaso et al. | |
| 9,794,301 B1* | 10/2017 | Urbach | H04L 65/1069 |
| 2002/0139658 A1* | 10/2002 | Kanakasabapathy | |
| | | | H01J 37/321 |
| | | | 204/164 |
| 2004/0104683 A1* | 6/2004 | Leung | H01J 27/18 |
| | | | 315/111.81 |
| 2009/0236547 A1* | 9/2009 | Huang | H01J 37/20 |
| | | | 250/492.21 |
| 2012/0252195 A1* | 10/2012 | Jones | H01J 37/08 |
| | | | 438/514 |
| 2013/0287963 A1* | 10/2013 | Radovanov | C23C 14/48 |
| | | | 427/523 |
| 2014/0077699 A1 | 3/2014 | Smith et al. | |
| 2015/0255242 A1 | 9/2015 | Divergilio et al. | |
| 2016/0276134 A1 | 9/2016 | Collins et al. | |
| 2017/0032937 A1 | 2/2017 | Distaso et al. | |

OTHER PUBLICATIONS

A.J.T. Holmes. Negative Hydrogen Ion Beams. Plasma Physics and Controlled Fusion, 1992, pp. 653-676, vol. 34, No. 5, IOP Publishing Ltd. and Pergamon Press.

* cited by examiner

NEGATIVE RIBBON ION BEAMS FROM PULSED PLASMAS

This application is a continuation of U.S. patent application Ser. No. 14/811,272 filed Jul. 28, 2015, the disclosure of which is incorporated herein by reference in its entirety.

FIELD

Embodiments relate to an apparatus and method for extracting negative ion beams from an ion source, and more particularly, extracting a negative ribbon ion beam through the use of a pulsed plasma.

BACKGROUND

Ions are used in a plurality of semiconductor processes, such as implantation, amorphization, deposition and etching processes. In many embodiments, positive ions are created from a plasma and are used to perform these processes.

For example, an RF ion source may be used. This RF ion source may include an RF antenna, to which RF power is applied. The RF antenna may be disposed near a wall of the chamber, which may be made of a dielectric material. One or more gas containers may be in communication with the chamber so as to supply feed gas to the chamber of the RF ion source. The excitation of the RF antenna results in the creation of electromagnetic energy, which may excite feed gas disposed with the chamber of the RF ion source to create a plasma. Ions from this plasma may be extracted from the RF ion source using, for example, extraction electrodes, and directed toward a workpiece. These extracted ions may become implanted in the workpiece.

Pulsed electronegative plasmas are promising candidates for improving etch, deposition processes for precision material modifications and microelectronics fabrication. Negative ions can be used to reduce charge build-up on the devices and provide "charge free" ion beam processing. In addition, pulsed electronegative plasmas can have extremely high negative ion to electron density ratio and can be used as a negative ion source. When negative ions dominate in the afterglow plasma, then electron filtering at the extraction aperture is not necessary. Electron filtering is typically done in a continuous (cw) negative ion sources.

In certain embodiments, it may be beneficial to create a negative ion beam. Further, it would be advantageous if this negative ion beam can be adjusted, so that parameters, such as neutral to ion flux ratio, angle control, and uniformity, can be readily controlled.

SUMMARY

An apparatus and method for the creation of negative ion beams is disclosed. The apparatus includes an RF ion source, having an extraction aperture. An antenna disposed proximate a dielectric window is energized by a pulsed RF power supply. While the RF power supply is actuated, a plasma containing primarily positive ions and electrons is created. When the RF power supply is deactivated, the plasma transforms into an ion-ion plasma. Negative ions may be extracted from the RF ion source while the RF power supply is deactivated. These negative ions, in the form of a negative ribbon ion beam, may be directed toward a workpiece at a specific incident angle. Further, both a positive ion beam and a negative ion beam may be extracted from the same ion source by pulsing the bias power supply multiple times each period.

According to one embodiment, an apparatus for creating a negative ribbon ion beam is disclosed. The apparatus comprises an ion source having a plurality of chamber walls defining an ion source chamber and having an extraction aperture; an RF antenna disposed proximate one of the plurality of chamber walls of the ion source chamber; an RF power supply in communication with the RF antenna, and outputting a first RF power level for a first time duration to the RF antenna to create a plasma within the ion source chamber from a feed gas and outputting a second RF power level, lower than the first RF power level, for a second time duration; and a bias power supply to create a voltage difference between a plasma disposed in the ion source chamber and a workpiece, such that the bias power supply is pulsed to create the voltage difference during at least a portion of the second time duration, so as to extract the negative ribbon ion beam from the ion source chamber through the extraction aperture. In certain embodiments, at least one of the plurality of chamber walls is electrically conductive and the bias power supply is in communication with electrically conductive chamber walls of the ion source chamber and the bias power supply provides a negative pulse to the electrically conductive chamber walls. In certain embodiments, the bias power supply is in communication with a platen on which the workpiece is disposed, and the bias power supply provides a positive pulse to the platen. In certain embodiments, extraction optics are disposed outside the ion source chamber and proximate the extraction aperture to manipulate the negative ribbon ion beam. In certain embodiments, a low work function material is disposed on an interior surface of at least one of the plurality of chamber walls.

According to another embodiment, a method of extracting a negative ribbon ion beam is disclosed. The method comprises applying a first RF power level for a first time duration to a RF antenna proximate an ion source chamber to create a plasma within the ion source chamber from a feed gas and a second RF power level, lower than the first RF power level, for a second time duration; pulsing a bias voltage to attract negative ions from an ion source chamber, as a negative ribbon ion beam, through an extraction aperture during at least a portion of the second time duration; and repeating the applying, and pulsing a plurality of times. In certain embodiments, the method further comprises determining a phase delay between an expiration of the first time duration and the pulsing so as to maximize a current of the negative ribbon ion beam. In certain embodiments, the method further comprises varying the first time duration, the second time duration, and a phase delay between an expiration of the first time duration and the pulsing so as to control a composition of the negative ribbon ion beam.

According to another embodiment, a method of extracting a ribbon ion beam is disclosed. The method comprises applying a RF power level for a first time duration from a RF power supply to a RF antenna proximate an ion source chamber to create a plasma within the ion source chamber from a feed gas and disabling the RF power supply for a second time duration to reduce an electric field in the ion source chamber; waiting a phase delay after disabling the RF power supply to allow electrons in the ion source chamber to cool and to attach to atoms or molecules in the ion source chamber and create negative ions; and creating a negative voltage difference between the plasma in the ion source chamber and a workpiece during a portion of the second time duration so as to attract a negative ribbon ion beam toward the workpiece. In certain embodiments, the phase delay is selected to maximize a beam current of the negative ribbon ion beam. In certain embodiments, the negative voltage difference only occurs while the RF power supply is disabled. In certain embodiments, the method further comprises creating a positive voltage difference between the plasma in the ion source chamber and a workpiece during a portion of the first time duration, so as to extract a positive ion beam during the first time duration.

BRIEF DESCRIPTION OF THE FIGURES

For a better understanding of the present disclosure, reference is made to the accompanying drawings, which are incorporated herein by reference and in which.

DETAILED DESCRIPTION

As described above, in certain embodiments, negative ion beams are beneficial. As is well known, traditional ion sources typically generate plasmas that contain mostly positive ions and electrons. To create a negative ion beam, it may be beneficial to extract negative ions during the afterglow of the plasma. In the afterglow, the electron density and temperature decreases to sufficiently low values such that the charge balance in the plasma is sustained between positive and negative ions.

Figure 1A:
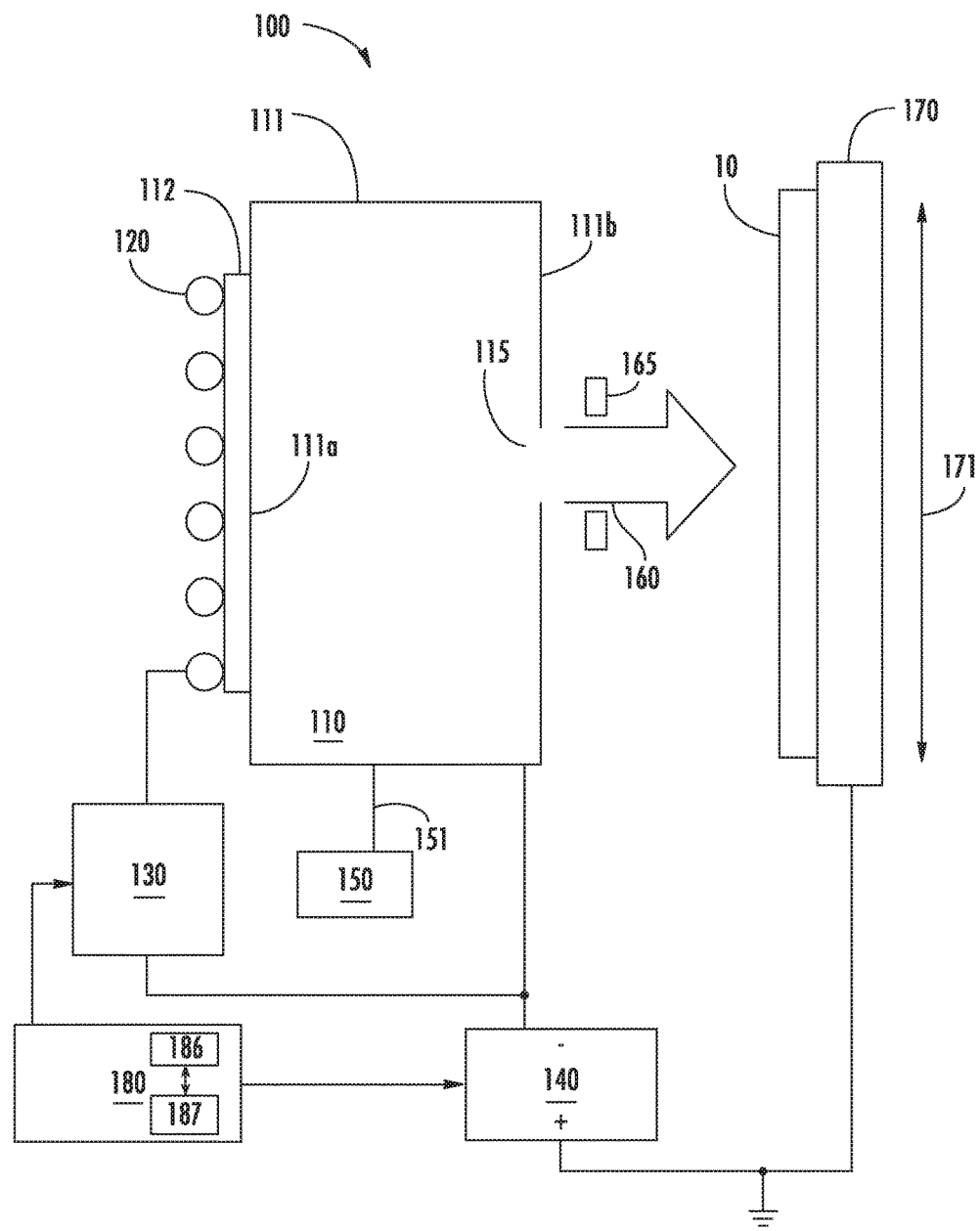
FIG. 1A shows an RF ion source according to one embodiment.

FIG. 1A shows a first embodiment of an ion source that may be used to create a negative ribbon ion beam. In this embodiment, an RF ion source 100 is illustrated. The RF ion source 100 comprises a plurality of chamber walls 111 defining an ion source chamber 110. A first chamber wall 111a, or a portion thereof, may be constructed of a dielectric material, such as quartz or alumina, forming a dielectric window 112. An RF antenna 120 may be disposed proximate the first chamber wall 111a, proximate the dielectric window 112, on the outside of the ion source chamber 110. The RF antenna 120 may comprise an electrically conductive material, such as copper, which may be wound in a spiral fashion. An RF power supply 130 is in electrical communication with the RF antenna 120. The RF power supply 130 may supply an RF power to the RF antenna 120. The power supplied by the RF power supply 130 may be between 0.05 and 10 kW and may be any suitable frequency, such as between 1 and 40 MHz. Further, the power supplied by the RF power supply 130 may be pulsed, as described in more detail below. For example, the RF power supply 130 may be capable of generating a plurality of different RF power levels, such as in a predetermined sequence.

In certain embodiments, certain chamber walls 111, with the exception of the dielectric window 112, are electrically conductive, and may be constructed of a metal or other conductive material. In certain embodiments, these chamber walls 111 may be electrically biased. In certain embodiments, the chamber walls 111 may be grounded. In other embodiments, the chamber walls 111 may be biased at a voltage by bias power supply 140.

In certain embodiments, the bias voltage may be a constant (DC) voltage. In other embodiments, the bias voltage may be pulsed. In these embodiments, the bias power supply 140 may be a power supply that is capable of pulsing or otherwise modulating its output. In another embodiment, the bias power supply 140 may comprise a traditional power supply that outputs a fixed voltage. The fixed output of this power supply may be in communication with a switch or other pulse modulator, which is capable of switching between the output of the power supply and another voltage, such as ground, for example. Therefore, throughout this disclosure, the phrase "bias power supply" is intended to denote a single power supply that is capable of modulating its output, or a combination of one or more power supplies and a pulse modulator or switch, that allows different voltages to be created.

The bias voltage applied to the chamber walls 111 establishes the potential of the plasma within the ion source chamber 110. The difference between the electrical potential of the plasma and the electrical potential of the workpiece 10, referred to as the extraction voltage, determines which polarity of ions is extracted through the extraction aperture 115. For example, if the plasma is more negative than the workpiece, negatively charged ions and electrons will be attracted to the workpiece 10.

A second chamber wall 111b, which may be opposite the first chamber wall 111a, includes an extraction aperture 115. The extraction aperture 115 may be an opening through which the ions generated in the ion source chamber 110 are extracted and directed toward a workpiece 10. The extraction aperture 115 may be any suitable shape. In certain embodiments, the extraction aperture 115 may be oval or rectangular shaped, having one dimension, referred to as the length, which may be much larger than the second dimension, referred to as the height. In these embodiments, negative ions may be extracted through the extraction aperture 115 as a negative ribbon ion beam 160. The second chamber wall 111b containing the extraction aperture 115 may be made from a conductive material, or an insulating material, such as quartz.

Extraction optics 165 may be disposed between the extraction aperture 115 and the workpiece 10. These extraction optics 165 may be used to direct or other manipulate the negative ribbon ion beam 160 as the ion beam travels toward the workpiece 10. For example, blockers, electrodes, triodes or tetrodes may be used to control the ion beam mean angle and angle spread of the ion beam. In certain embodiments, the extraction optics may be used to define a specific angle of incidence of the negative ribbon ion beam 160 relative to the workpiece 10. In some instances, the angle of incidence may be as high as 7 degrees. In certain embodiments, an angled negative ribbon ion beam 160 may be beneficial for patterning or spacer etch.

A gas container 150 may be in communication with the ion source chamber 110, such as via a gas inlet 151. The gas container 150 may hold one or more feed gasses, which are used to create a plasma within the ion source chamber 110.

The feed gasses may comprise any suitable dopant, including but not limited to boron, phosphorus, and arsenic. In certain embodiments, the feed gasses may comprise etching species, such as atoms or molecules containing hydrogen or fluorine. In certain embodiments, the feed gasses may be other species, such as atoms or molecules containing Group 3, Group 4 or Group 5 elements. As such, the feed gas that is introduced into the ion source chamber 110 is not limited by this disclosure. The flow of gas into the ion source chamber 110 may be controlled by a mass flow controller disposed proximate the gas inlet 151. The pressure within the ion source chamber 110 may be in the range of less than 10 mTorr.

Disposed proximate the extraction aperture 115 is the workpiece 10, which may be disposed on a platen 170. The platen 170 may be attached to an actuator to allow the platen 170 to move, for example, in direction 171. The platen 170 may be grounded in certain embodiments.

A controller 180, comprising a processing unit 186 and a storage element 187, may be in communication with at least the RF power supply 130 and the bias power supply 140. The controller 180 may actuate the RF power supply 130 and the bias power supply 140 to create the waveforms shown in FIGS. 2A-2B. The processing unit 186 may be any suitable processor, such as a personal computer, embedded processor, or integrated circuit. The storage element 187 may be any form of non-transitory storage, such as but not limited to semiconductor memory, magnetic memory, and optical memory. The storage element 187 may include instructions that may be executed by the processing unit 186. When these instructions are executed, the RF ion source 100 may operate as described below.

Figure 1B:
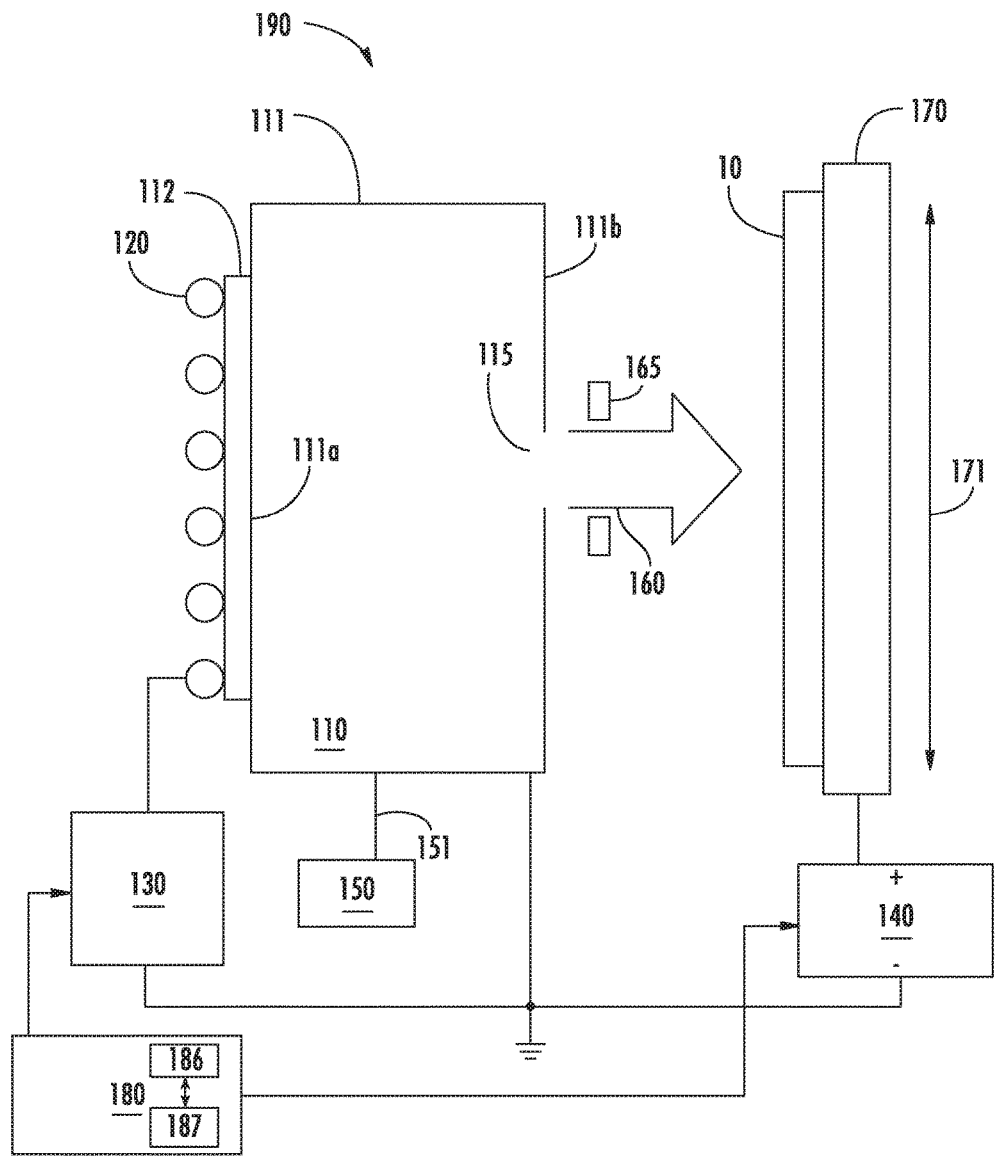
FIG. 1B shows an RF ion source according to another embodiment.

FIG. 1B shows a second embodiment of the RF ion source 190. FIG. 1B is similar to the embodiment of FIG. 1A, except that the difference in electrical potential between the plasma and the workpiece 10 is established in a different manner. In this embodiment, like components have been given identical reference designators. In FIG. 1B, the chamber walls 111 may be biased at a fixed voltage, such as ground. The platen 170 may be in electrical communication with a bias power supply 140, which is used to bias the platen 170. By varying the voltage applied by the bias power supply 140 to the platen 170, while maintaining the plasma at ground potential, it is possible to attract positive ions, negative ions, or no charged particles from the ion source chamber 110 to the workpiece 10. For example, the application of a positive voltage from the bias power supply 140 to the platen 170 will cause negative ions from the ion source chamber 110 to be attracted to the workpiece 10 in the form of a negative ribbon ion beam.

Note that to create the same effect, the polarity of the bias voltage applied to the platen 170 in FIG. 1B is opposite the bias voltage applied to the chamber walls in FIG. 1A. In other words, a negative voltage applied to the chamber walls 111 in FIG. 1A will cause negative ions to be attracted to the workpiece 10. However, a positive voltage applied to the platen 170 in FIG. 1B will cause negative ions to be attracted to the workpiece 10. Thus, throughout this disclosure, the term "extraction voltage" is defined as the voltage difference between the plasma and the workpiece, expressed as $V_{plasma} - V_{workpiece}$. Thus, a negative extraction voltage denotes a negative bias voltage in FIG. 1A and a positive bias voltage in FIG. 1B.

A controller 180, comprising a processing unit 186 and a storage element 187, may be in communication with the RF power supply 130 and the bias power supply 140. The controller 180 may actuate the RF power supply 130 and the bias power supply 140 to create the waveforms shown in FIG. 2A-2B. The processing unit 186 and the storage element 187 may be as described above. When the instructions in the storage element 187 are executed, the RF ion source 190 operates as described below.

Although FIGS. 1A-1B show a controller 180, it is understood that other embodiments are also possible. For example, the RF power supply 130 and the bias power supply 140 may each be in communication with a respective controller. These separate controllers may communicate with each other to remain synchronized. In other embodiments, these separate controllers may be synchronized at a single point in time and may operate autonomously thereafter. Thus, throughout this disclosure, the term "controller" refers to the one or more controllers that are used to control the RF power supply 130 and the bias power supply 140. Further, FIGS. 1A-1B show the controller 180 as being a separate component. However, it is understood that the controller 180 may be integrated into another component. For example, the controller 180 may be integrated into the RF power supply 130 or the bias power supply 140. In other words, the figures are intended to represent the various functions performed by the RF ion source 100, however, these functions may be arranged in various configurations. The configuration shown in FIG. 1A-1B is but one possible arrangement of the components.

In operation, feed gas from gas container 150 is introduced to the ion source chamber 110 via gas inlet 151. An RF power is applied by the RF power supply 130 to the RF antenna 120. This RF power energizes the feed gas within the ion source chamber 110, producing a plasma, which contains mostly positive ions and electrons. By creating a voltage differential between the plasma and the workpiece 10 (i.e. a non-zero extraction voltage), ions are extracted from the ion source chamber 110 through the extraction aperture 115 as a ribbon ion beam and impact the workpiece 10. As described above, this extraction voltage may be created by varying the voltage applied by bias power supply 140 to the chamber walls 111, as shown in FIG. 1A. Alternatively, the extraction voltage may be created by applying a bias voltage to the platen 170 using bias power supply 140, as shown in FIG. 1B.

As described above, the RF power supply 130 may operate in a pulsed or modulated mode, such that the RF power supply 130 applies a first RF power level to the RF antenna 120 during a first time duration, and then applies a second RF power level to the RF antenna 120 during a second time duration. The second RF power level may be less than the first RF power level. In certain embodiments, the second RF power level is 0 volts. In certain embodiments where the second RF power level is greater than 0 volts, a mechanism to filter extracted electrons may be used. The sum of the first time duration and the second time duration defines the period of the RF power supply 130. In some embodiments, the period of the RF power supply may be 200 μsec, although other time durations may also be used. The duty cycle of the RF power supply 130 is defined as the ratio of the first time duration to the period of the RF power supply 130. In some embodiments, the first time duration and the second time duration may be of equal duration, such that the RF power supply 130 has a 50% duty cycle. However, other duty cycles are also within the scope of the disclosure. The power applied by the RF power supply 130 during the first time duration may be between 50 W and 10 kW, although other power levels may also be used. The first time duration may be between 25 μsec and 10 milliseconds.

Figure 2A:
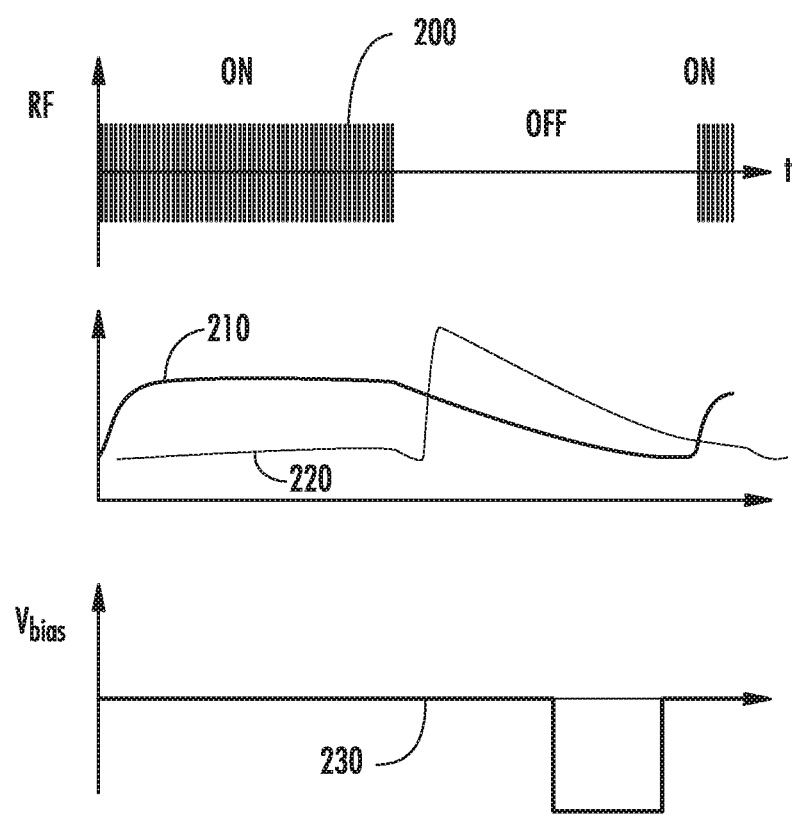
FIG. 2A shows a timing diagram used to extract a negative ribbon ion beam from the RF ion source.

FIG. 2A shows a timing diagram, wherein line 200 shows a representative power waveform output by the RF power supply 130. In this embodiment, the duty cycle of the RF power supply 130 is 50%, although other values may be used. The period of this waveform may be between 100 μsec and 10 milliseconds. Line 210 is representative of the number of electrons in the plasma. Line 220 is representative of the number of negative ions in the plasma. Note that while the RF power supply 130 outputs the first RF power level, the number of electrons is greater than the number of negative ions, as the energy of the RF antenna causes the creation of a plasma that comprises mostly electrons and positive ions.

When the RF power supply 130 outputs the second RF power level, which may be 0 volts in this example, the plasma cools, and the number of electrons, as shown in line 210, decreases in the plasma afterglow. Meanwhile, the number of negative ions actually increases when the RF power supply 130 outputs the second RF power level, forming an ion-ion plasma. Line 230 represents the voltage difference between the voltage of the plasma and the voltage of the workpiece 10, referred to as the extraction voltage and expressed as $V_{plasma} - V_{workpiece}$. This extraction voltage is created using controller 180, by the synchronized pulsing of the output of bias power supply 140. The period of the bias power supply waveform may be the same as the period of the RF power supply 130. When the extraction voltage is zero, ions are not attracted toward the workpiece 10. When this extraction voltage is negative, the plasma is more negative than the workpiece 10, and negative ions and electrons are attracted to the workpiece 10. By creating a negative extraction voltage between the plasma and the workpiece when the RF power supply 130 is not actuated, it is possible to create a negative ribbon ion beam 160. Further, by introducing a phase delay between the time when the RF power supply 130 transitions to the second RF power level and the creation of this voltage difference, the ratio of negative ions to electrons may be maximized. The controller 180 may coordinate the actions of the RF power supply 130 and the bias power supply 140 to achieve these waveforms. As described above, in certain embodiments, two separate controllers are used to control the RF power supply 130 and the bias power supply 140.

The duty cycle of the bias power supply 140 is defined as the ratio of the pulse width of the extraction voltage to the period of the bias power supply 140, which may equal the period of the RF power supply 130. In certain embodiments, the duty cycle of the RF power supply 130 may be 50%, while the duty cycle of the bias power supply 140 may be about 20%. In certain embodiments, the duty cycle of the bias power supply 140 may be based on the duty cycle of the RF power cycle. In certain embodiments, the duty cycle of the RF power supply 130 may be such that the entire pulse of the bias power supply 140 occurs during the second time duration while the RF power supply 130 outputs the second RF power level.

Further, assume the RF power supply 130 outputs the first RF power level at the beginning of the period, and outputs the second RF power level at a point that is 50% through the period. In this case, the controller 180 may pulse the bias power supply 140 at a point at least 65% through the period. In other words, the bias power supply 140 may be pulsed after delaying from the output of the second RF power level from the RF power supply 130. The pulse for the bias power supply 140 may be deactivated prior to the next point in time when the RF power supply 130 outputs the first RF power level. In other words, in certain embodiments, the entire pulse width of the bias power supply 140 occurs while the RF power supply 130 is outputting the second RF power level.

By varying the synchronous pulsed plasma parameters, such as the period of the RF power supply 130, the duty cycle of the RF power supply 130, the duty cycle of the bias power supply 140 (i.e. the pulse width) and phase delay between the output of the second RF power level and the synchronized pulsing of the bias power supply 140, the negative ion current intensity may be optimized and the transition from electron-ion to ion-ion plasma may be controlled.

The waveforms shown in FIG. 2A may be used to extract a negative ribbon ion beam to direct toward a workpiece 10. This negative ribbon ion beam may be used for etching processes, deposition processes or implant processes.

Figure 2B:
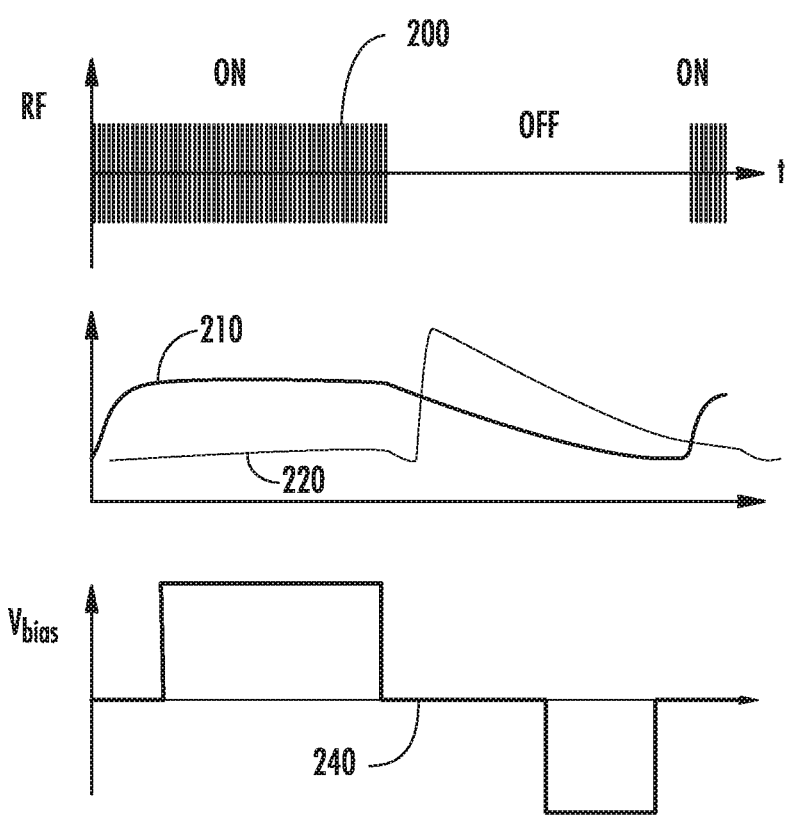
FIG. 2B shows a timing diagram used to extract both a positive ribbon ion beam and a negative ribbon ion beam from the RF ion source.

FIG. 2B shows a second representative timing diagram. In this embodiment, both a positive ribbon ion beam and a negative ribbon ion beam are extracted from the ion source chamber 110. As described above, line 200 represents the RF power applied to the RF antenna 120 by the RF power supply 130. Lines 210, 220 represent the relative number of electrons and negative ions, respectively. Line 240 represents the voltage difference between the plasma and the workpiece 10, as known as the extraction voltage and is expressed as $V_{plasma} - V_{workpiece}$. In this embodiment, the controller 180 actuates the bias power supply 140 twice during each period. The first pulse is a positive extraction voltage, which causes positive ions from the ion source chamber 110 to be attracted to the workpiece 10. This first pulse is created when the RF power supply 130 is actuated at the first RF power level. This first pulse may be actuated anytime during the time that the RF power supply 130 is actuated at the first RF power level. The second pulse is a negative extraction voltage, which causes negative ions from the ion source chamber 110 to be attracted to the workpiece 10. As described above with respect to FIG. 2A, the second pulse is created when the RF power supply 130 is actuated at the second RF power level.

In certain embodiments, the positive ribbon ion beams and negative ribbon ion beams can both be used to perform deposition, etching or implantation processes. Additionally, the use of both ribbon ion beams may reduce the accumulation of charge on the workpiece 10.

The positive and negative ion beams may have the same energy, or in other embodiments, may have different energies. In certain embodiments, both ion beams are delivered to the workpiece for processing. In other embodiments, the ion beams are delivered at different times during the processing of the workpiece.

Figure 3:
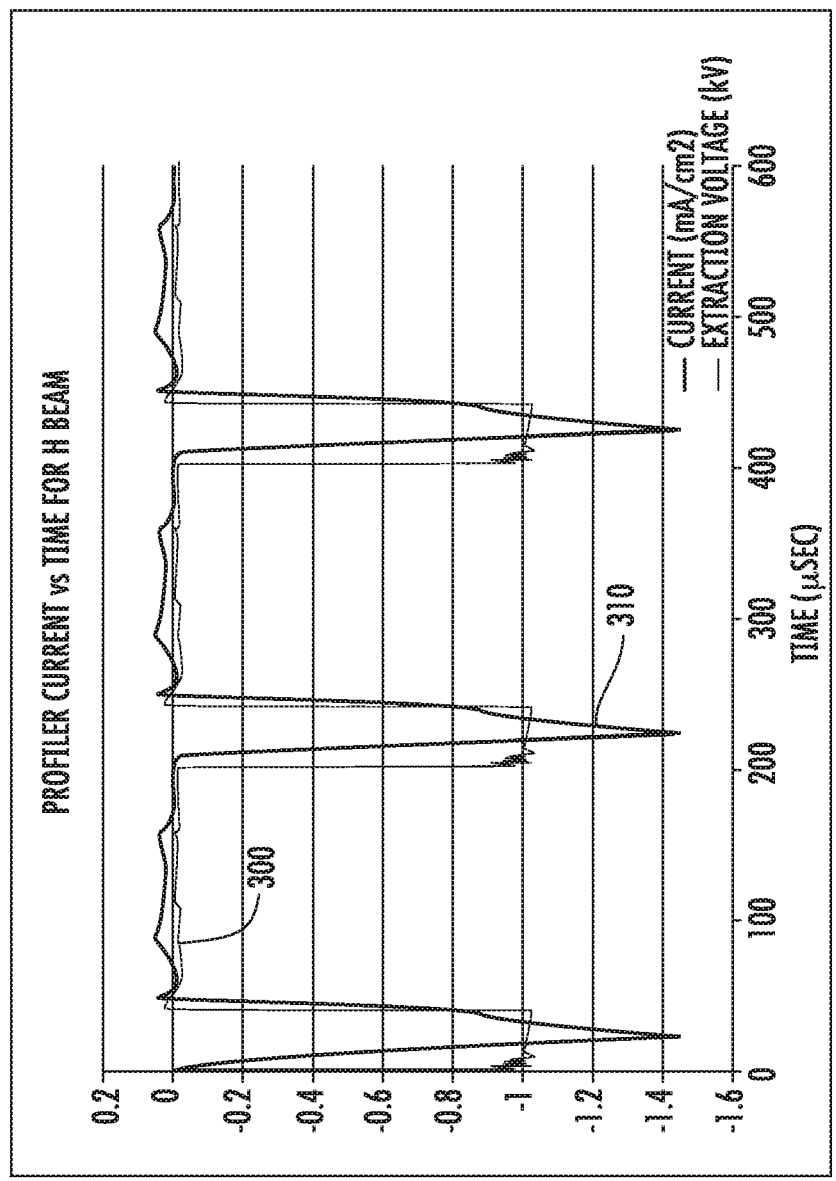
FIG. 3 shows the relationship between bias voltage and negative ion beam current.

This apparatus and method allows the generation of negative ribbon ion beams. FIG. 3 shows a timing diagram showing the relationship between bias voltage and negative ion beam current. Line 300 represents the extraction voltage applied by the bias power supply 140. Line 310 shows the current of the extracted negative ribbon ion beam. In this figure, the period of the bias power supply is about 200 μsec, although other durations may be used. This graph represents ion beam current that may be generated using hydrogen as the feed gas. The other parameters, such as RF power level, RF duty cycle, and phase delay are in the range described above. The extraction voltage, or the voltage difference between the voltage of the plasma and the voltage of the workpiece 10, may be about 1 kV. This graph shows that a negative hydrogen ion beam is extracted during the pulses supplied by the bias power supply 140. The magnitude of the extracted ion beam may be roughly 1.4 mA/cm².

In some embodiments, the ion beam current of the negative ribbon ion beam may be improved. For example, it may be possible to coat the chamber walls 111 with a low work function material, such as tantalum. In certain embodiments, the regions around the extraction aperture 115 may be coated with the low work function material. The bombardment of this low work function material increases the surface temperature of the chamber walls 111 to roughly 300° C. or more, and may enhance surface ionization and secondary negative ion formation. In other words, the material used to coat the chamber walls 111 may contribute electrons to the plasma.

Additionally, this negative ribbon ion beam may be manipulated in much the same way that positive ion beams are manipulated. Specifically, as described above, extraction optics 165 may be disposed outside the ion source chamber 110 proximate the extraction aperture 115. These extraction optics 165 may be used to allow the negative ribbon ion beam to strike the workpiece 10 at a specific incident angle.

Unexpectedly, the mass spectrum of negative ions may be different from the mass spectrum of positive ions for the same feed gas at similar gas pressure and RF power levels. Electron attachment processes in the plasma and on the chamber walls control negative ion production, which limits the ion flux from weakly electronegative plasmas. This fact may be used to control the species created and extracted from the ion source chamber 110.

Figure 4A:
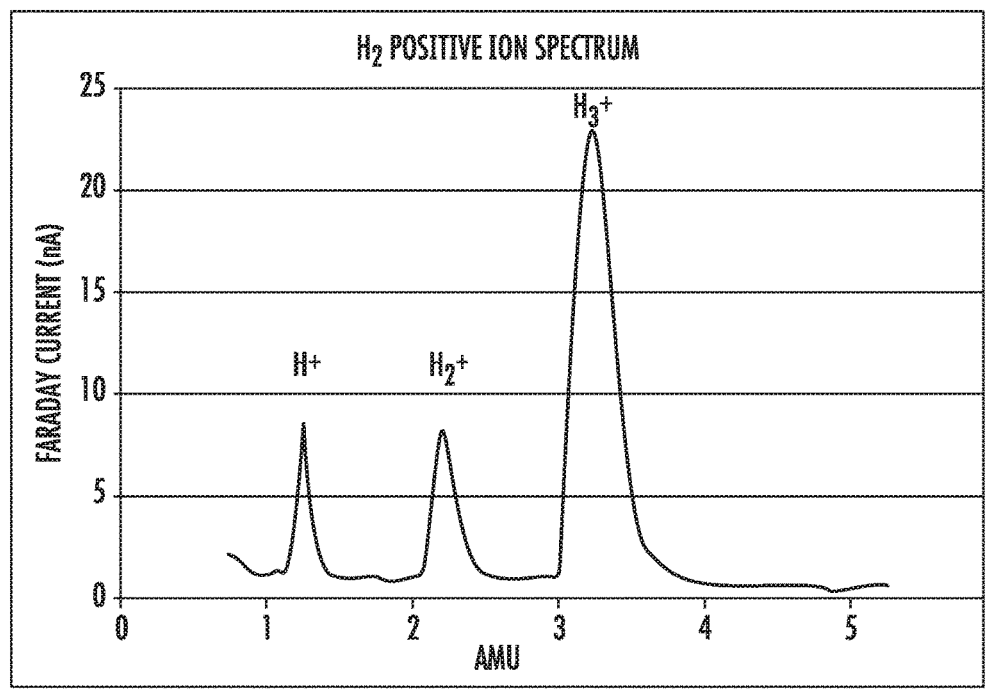
FIG. 4A shows the mass spectrum of positive ions extracted using from a RF ion source using hydrogen as the feedgas.

For example, FIG. 4A shows the mass spectrum of positive ions extracted in one configuration. In this case, the feed gas was hydrogen, the extraction voltage was 1 kV, and the RF power supply 130 was operated continuously. FIG. 4A shows that positive ions of $H^+$, $H_2^+$ and $H_3^+$ are all generated in this configuration. Further, $H_3^+$ ions were the most common, having almost three times more current than the $H^+$ and $H_2^+$ ions. Of course, the most abundant ion may change as a result of differences in gas pressure and RF power levels.

Figure 4B:
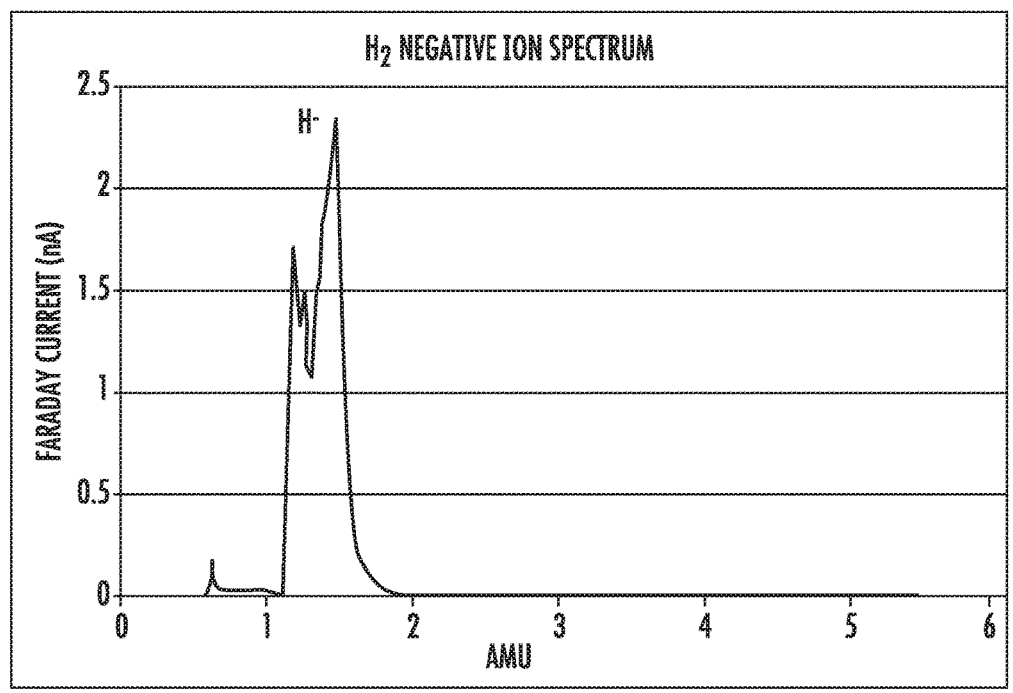
FIG. 4B shows the mass spectrum of negative ions extracted using the RF ion source using hydrogen as the feedgas.

In FIG. 4B, a negative ion beam was created using hydrogen as a feed gas. In this test, the output of the RF power supply 130 was modulated at a 50% duty cycle, where the second RF power level was 0 volts. The bias power supply 140 was operated with a duty cycle of 20%. In this test, the duty cycle of the RF power supply 130 was 200 µsec, and the bias power supply was pulsed after the RF power supply 130 was deactivated. In this test, almost all of the negative ions created were $H^-$ ions. In fact, the current of $H_2^-$ and $H_3^-$ ions was too small to be measured. In other words, the species extracted as a negative ion beam is limited to only $H^-$ ions, while the positive ion beam has three different species with different masses. Mass spectra were determined using a magnetic sector with a polarity switch that enables detection of positive and negative ion species in conjunction with a Faraday cup.

However, the positive ion beam current, shown in FIG. 4A, was about 10 times greater than the negative ion beam current shown in FIG. 4B.

Figure 5A:
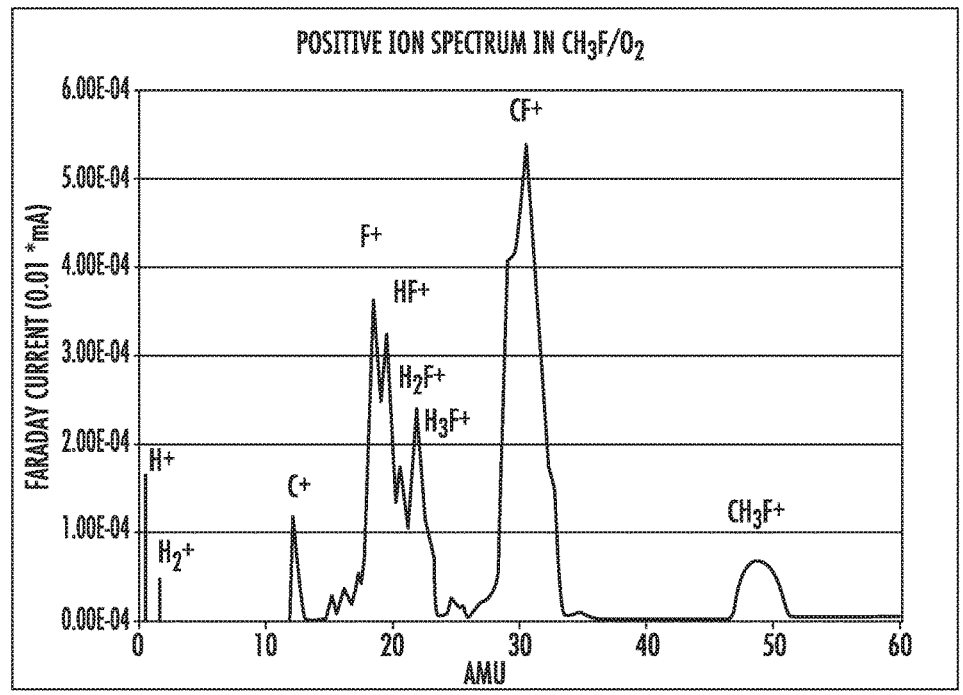
FIGS. 5A-5B shows the mass spectrum of positive ions and negative ions, respectively using a second feedgas.
Figure 5B:
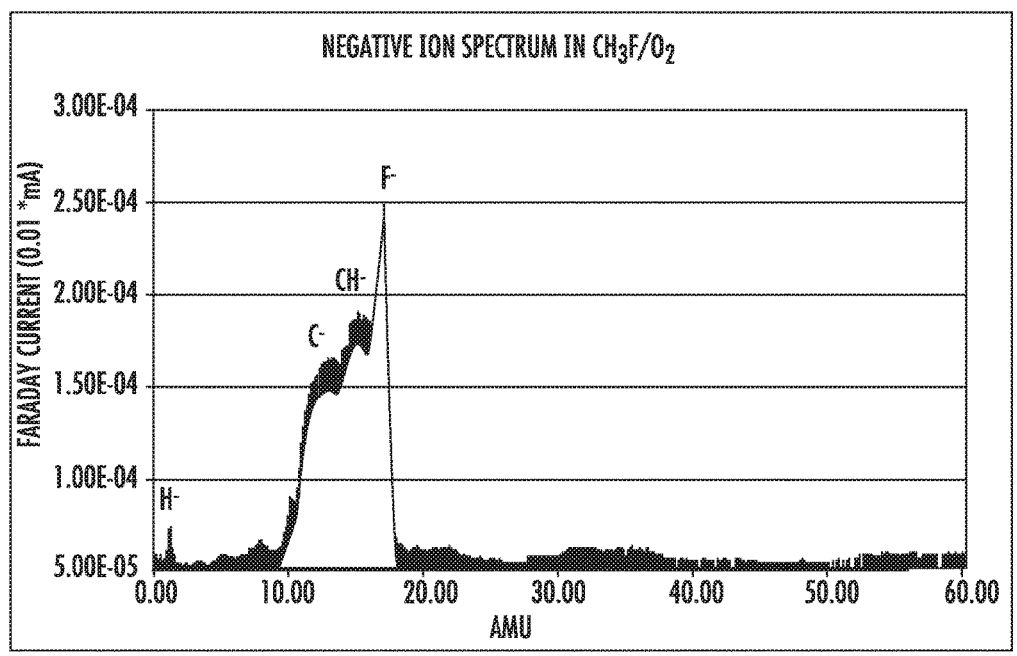

FIGS. 5A-5B show a second configuration, where $CH_3F$ and $O_2$ were used as the feed gas. In the case of positive ions, as shown in FIG. 5A, a large number of different species, include $H^+$, $H_2^+$, $C^+$, $F^+$, $HF^+$, $H_2F^+$, $H_3F^+$, $CF^+$ and $CH_3F^+$, were generated. In contrast, a much smaller number of negative species were generated. FIG. 5B shows the currents for $H^-$, $C^-$, $CH^-$ and $F^-$ ions. All other species were generated in an amount too small to be measured.

The smaller number of species that are created as negative ions may simplify the design of the ion source. For example, in certain embodiments, it may be possible to eliminate the mass analyzer, so that all extracted ions are implanted in the workpiece. Thus, by manipulating the duty cycle and period of the RF power supply 130, the duty cycle of the bias power supply 140 and the phase delay, the composition of the extracted negative ribbon ion beam can be controlled. This may allow a reduction of elimination of mass analysis in certain embodiments. However, in other embodiments, a mass analyzer may be used in conjunction with the RF ion source described herein.

Figure 6:
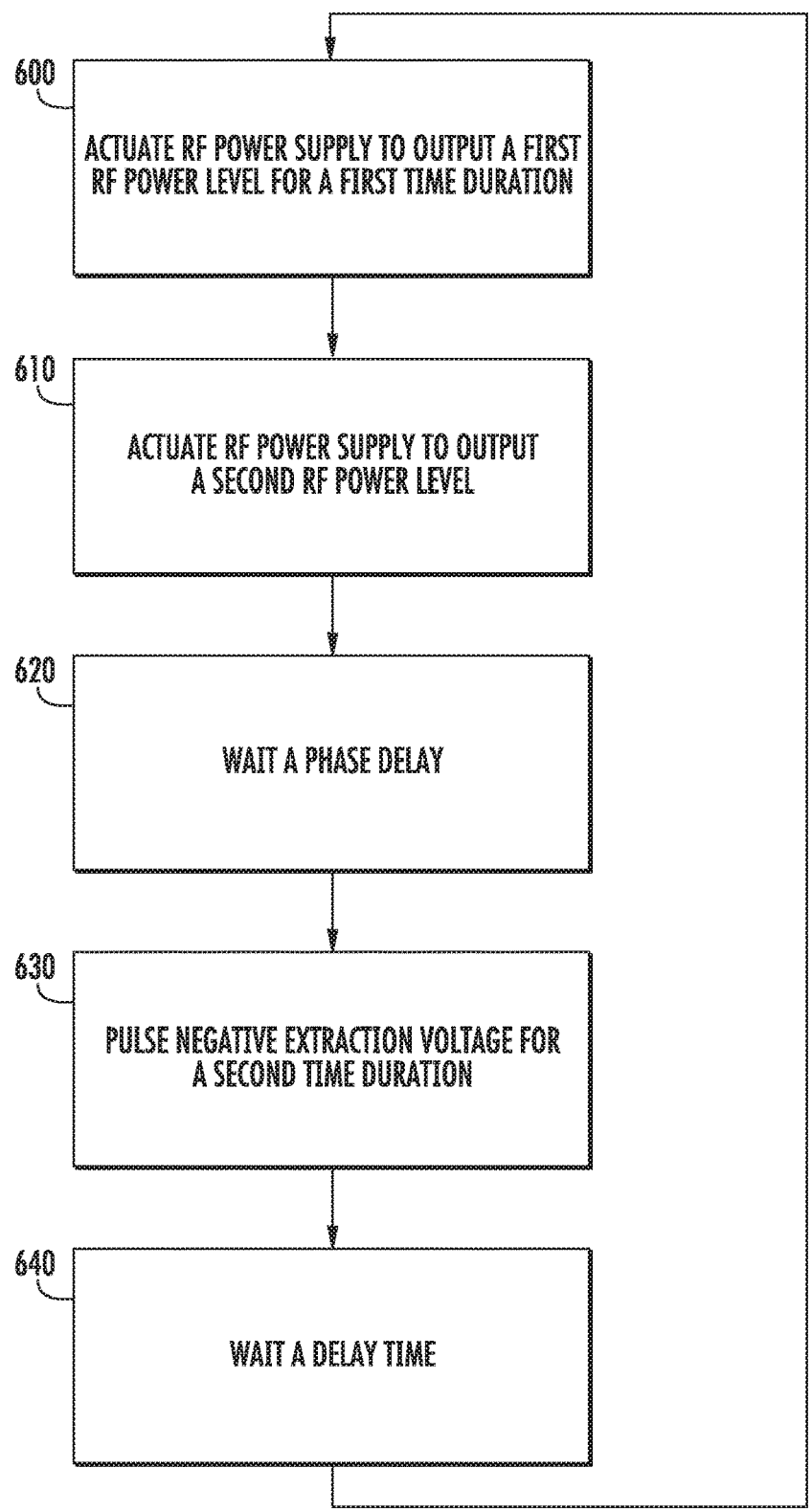
FIG. 6 illustrates a flowchart showing the creation of a negative ion beam.

FIG. 6 shows a flowchart that may be executed by the controller 180 to generate a negative ion beam. In certain embodiments, a non-transitory media may contain a software program, which when loaded into the storage element 187 of the controller 180, causes the controller 180 to execute these processes.

First, as shown in Process 600, the controller 180 actuates the RF power supply 130 so that the RF power supply outputs a first RF power having a frequency of between 1 and 20 MHz, and has an output power of, for example, between 0.050 kW and 5 kW. The RF power supply 130 may output the first RF power level for a first time duration. This first time duration may be between 100 µsec and 10 milliseconds, such as 100 µsec. The first RF power level causes the feed gas in the ion source chamber 110 to form a plasma, which is mainly positive ions and electrons.

After the expiration of the first time duration, the controller 180 causes the RF power supply 130 to output a second RF power level, as shown in Process 610. This deenergizes the plasma in the ion source chamber 110 and cools the electrons, which leads to a reduction in the number of electrons in the ion source chamber 110 and an increase in the number of negative ions. In certain embodiments, the second RF power level is 0 volts. As described above, in embodiments where the second RF power level is greater than 0 volts, electrons may be co-extracted with the negative ions. In these embodiments, electron filtering may be performed outside the extraction aperture 115 to deflect or separate the electrons from the negative ions to obtain a pure negative ribbon ion beam.

The controller 180 then waits a phase delay, as shown in Process 620. This phase delay may be as small as 0 µsec, or may be much larger, such as several milliseconds. The purpose of the phase delay is to allow the electrons in the plasma to dissipate, and the number of negative ions to increase. The phase delay is a parameter that may be tuned for controlling the attachment process in the plasma. Thus, negative ion current can be optimized using the phase delay. For example, maximum extracted negative ion current (during the bias pulse) may be a strong function of the initial electron temperature and plasma density. Electron attachment processes in the afterglow are maximized for a certain initial electron temperature and plasma density. For example, at a particular set of parameters, the phase delay can be used to shape the current pulse and intensity of the negative ion current. These parameters may include the period of the RF power supply, the duty cycle or first time duration of the RF power supply, the duty cycle of the bias power supply, the species of the feed gas, the gas process within the ion source chamber. In certain embodiments, the first RF power level and the phase delay define the initial and final electron temperatures.

After the phase delay, the controller 180 may pulse the bias power supply to create a negative extraction voltage for a second time duration, as shown in Process 630. While there is a negative extraction voltage, negative ions are attracted from the ion source chamber 110 to the workpiece 10, which is less negatively biased. Thus, it is during this pulse that the negative ribbon ion beam is extracted through the extraction aperture 115. This second time duration may be any suitable time, such as 40 μsec, although other values are also possible.

After pulsing the extraction voltage, the controller 180 waits a delay time, as shown in Process 640. After the delay time, the sequence repeats by returning to Process 600.

The sum of the first time duration, the second time duration, the phase delay and the delay time defines the period of the RF power supply 130. The ratio of the first time duration to the period of the RF power supply 130 defines the duty cycle of the RF power supply. In some embodiments, the first time duration may be equal to the sum of the second time duration, the phase delay and the delay time, such that the RF power supply 130 has a 50% duty cycle. However, in other embodiments, the RF power supply may have a different duty cycle, such between 5 and 95%.

The bias power supply 140 operates using the same period as the RF power supply 130. The ratio of the second time duration to the period defines the duty cycle of the bias power supply 140. In certain embodiments, the extraction voltage is pulsed for about 20% of the period of the RF power supply 130. However, other values are also possible.

In certain embodiments, the phase delay is determined based on the RF power level, the gas pressure within the ion source chamber 110, the period of the RF power supply and the feed gas used. In certain embodiments, the phase delay may be determined empirically to maximize the beam current.

In summary, the controller 180 operates the RF power supply 130 and the bias power supply 140 such that each has the same period. However, the duty cycle and phase of each is different from the other to achieve the resulting negative ion beam. For example, the RF power supply 130 may have a period and a first duty cycle. The bias power supply 140 may have the same period and a second duty cycle. Further, the phase difference between these two power supplies is such that the bias power supply 140 is pulsed while the RF power supply outputs the second RF power level (i.e. may be in the "off" state).

Although not shown in FIG. 6, in certain embodiments, the controller 180 may pulse a positive extraction voltage during a portion of Process 600 to extract a positive ion beam from the ion source chamber 110.

As described above, in certain embodiments, the RF power supply 130 and the bias power supply 140 may be regulated using two separate controllers. In this embodiment, the RF controller is responsible for the period and duty cycle of the RF power supply 130, while the bias controller is responsible for the period and duty of the bias power supply 140. These two controllers may be synchronized to establish the phase delay between their outputs.

For example, the negative ribbon ion beam may be extracted by using the RF power supply 130 to repeatedly apply a first RF power level to the RF antenna for a first time duration and a second RF power level to the RF antenna for a second time duration. The bias power supply 140 may be synchronously pulsed to attract negative ions from the ion source chamber, in the form of a negative ribbon ion beam, through the extraction aperture during at least a portion of the second time duration. Further, in certain embodiments, the phase delay between the expiration of the first time duration and the pulsing is determined so as to maximize the current of the negative ribbon ion beam. In certain embodiments, the first time duration, the second time duration and the phase delay are varied so as to control the composition of the negative ribbon ion beams, in terms of the extracted negative species.

The present apparatus has many advantages. First, in certain applications, negative ion beams are preferred. For example, negative ion beams may be beneficial for etching and deposition processes. Secondly, the mass spectrum of negative ion beams may differ from that of a similarly generated positive ion beam. This may allow the elimination of mass analysis in certain embodiments. Additionally, both positive and negative ion beams can be extracted from a single ion source, which may be beneficial in etching of next generation micro-devices having a characteristic feature size that is less than 10 nm. A negative ribbon ion beam at a small incident angle may be especially beneficial for the $Si_3N_4$ spacer etch and gate patterning. Negative ion beams could also enable other processes, such as charge-free plasma processing, high etch selectivity and anisotropy, etch uniformity and others.

In addition, the selection of the various parameters, such as the period and duty cycle of the RF power supply 130, the duty cycle of the bias power supply 140, and the phase delay, enables control of the plasma potential, the electron temperature, the ion to electron flux ratio and the ion to neutral flux ratio.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of extracting a negative ribbon ion beam from an ion source chamber at a particular angle, comprising:
    applying a first RF power level for a first time duration to a RF antenna proximate an ion source chamber to create a plasma within the ion source chamber from a feed gas and a second RF power level, lower than the first RF power level, for a second time duration, wherein the plasma cools during the second time duration to create an afterglow plasma in which a number of negative ions in the plasma increases;
    pulsing a bias voltage to attract negative ions from an ion source chamber, as a negative ribbon ion beam, through an extraction aperture during at least a portion of the second time duration; and
    using extraction optics disposed outside of the ion source chamber between the extraction aperture and a workpiece to define a specific angle of incidence of the negative ribbon ion beam relative to a workpiece.

2. The method of claim 1, wherein the extraction optics comprises blockers, electrodes, triodes or tetrodes.

3. The method of claim 1, wherein the extraction optics also control an ion beam mean angle and angle spread of the negative ribbon ion beam.

4. The method of claim 1, wherein the specific angle of incidence is as high as 7 degrees.

5. The method of claim 1, wherein the second RF power level is ground.

6. An apparatus for creating a negative ribbon ion beam and a positive ribbon ion beam, comprising:
an ion source having a plurality of chamber walls defining an ion source chamber and having an extraction aperture;
an RF antenna disposed proximate one of the plurality of chamber walls of the ion source chamber;
an RF power supply in communication with the RF antenna, and outputting a first RF power level for a first time duration to the RF antenna to create a plasma within the ion source chamber from a feed gas and outputting a second RF power level, lower than the first RF power level, for a second time duration, wherein the second RF power level is selected such that the plasma cools during the second time duration to create an afterglow plasma in which a number of negative ions in the plasma increases; and
a bias power supply to create a positive extraction voltage during at least a portion of the first time duration to extract the positive ribbon ion beam from the ion source chamber and a negative extraction voltage during at least a portion of the second time duration to extract the negative ribbon ion beam from the ion source chamber, wherein extraction voltage is defined as a voltage difference between the plasma disposed in the ion source chamber and a workpiece.

7. The apparatus of claim 6, wherein at least one of the plurality of chamber walls is electrically conductive and the bias power supply is in communication with electrically conductive chamber walls of the ion source chamber and the bias power supply provides pulses to the electrically conductive chamber walls.

8. The apparatus of claim 6, wherein the bias power supply is in communication with a platen on which the workpiece is disposed, and the bias power supply provides pulses to the platen.

9. The apparatus of claim 6, comprising extraction optics disposed outside the ion source chamber and proximate the extraction aperture to manipulate the positive ribbon ion beam and the negative ribbon ion beam.

10. The apparatus of claim 6, further comprising a coating comprising a low work function material, disposed on an interior surface of at least one of the plurality of chamber walls to contribute electrons to the plasma.

11. The apparatus of claim 6, wherein the second RF power level is 0 volts.

12. The apparatus of claim 6, wherein the bias power supply delays a phase delay after an expiration of the first time duration before creating the negative extraction voltage.

13. The apparatus of claim 12, wherein the phase delay is selected so as to maximize a beam current of the negative ribbon ion beam.

14. The apparatus of claim 6, wherein the first time duration and the second time duration define a period of the RF power supply, and the RF power supply repeatedly outputs the first RF power level and the second RF power level, and wherein the bias power supply continuously outputs the positive extraction voltage and negative extraction voltage, and has a period equal to the period of the RF power supply.

* * * * *